United States Patent [19]
Hendrickson et al.

[11] 3,943,449
[45] Mar. 9, 1976

[54] MULTI-SPEED RAMP FOR A VARACTOR TUNING SYSTEM

[75] Inventors: Melvin C. Hendrickson, Elmhurst; Richard G. Merrell, Darien, both of Ill.

[73] Assignee: Zenith Radio Corporation, Chicago, Ill.

[22] Filed: Sept. 9, 1974

[21] Appl. No.: 504,638

[52] U.S. Cl. ................. 325/420; 325/453; 325/468
[51] Int. Cl.² ......................................... H04B 1/16
[58] Field of Search .......................... 325/418–423, 325/452, 453, 457, 458, 459, 462, 463–465, 468–470; 328/95–97, 132, 133, 152–154; 334/11, 14–16; 340/168 R

[56] References Cited
UNITED STATES PATENTS

| 3,560,858 | 2/1971 | Sakai et al. | 325/470 |
| 3,736,513 | 5/1973 | Wilson | 325/421 |
| 3,748,645 | 7/1973 | Kawashima | 325/465 |
| 3,766,483 | 10/1973 | Wolfram | 325/470 |
| 3,818,353 | 6/1974 | Sakamoto | 325/457 |
| 3,822,405 | 7/1974 | Sakamoto | 325/464 |

OTHER PUBLICATIONS
IEEE Spectrum on "TV Receiver Tuning Systems of the Future," by Doyle et al., Vol. 15, No. 2, 7/1969.

Primary Examiner—Robert L. Griffin
Assistant Examiner—Jin F. Ng
Attorney, Agent, or Firm—Joseph T. Downey; Nicholas A. Camasto

[57] ABSTRACT

An electronic all channel television tuning system has a presettable counter for deriving the number of the receivable television channel by counting, on a continuing sample basis, the varactor diode tuner local oscillator frequency. The derived channel number is supplied as an input of a comparator which includes separate tens and units channel number comparison sections. A channel number selector supplies an encoded desired channel number to another input of the comparator and to a frequency band decoder which establishes appropriate preset information for the counter. The system local oscillator frequency is varied by a voltage ramp circuit having two pairs of matched current sources and sinks of different capacity for supplying current, through respective transmission gates, to charge or discharge a tuning capacitor at different rates. A difference in the tens section of the comparator activates the transmission gates for both the larger and smaller capacity source-sink pairs, producing the high ramp speed. After equality in the tens digits only one of the small capacity source-sink pair is activated, under control of the units section of the comparator, to produce the low ramp speed.

11 Claims, 3 Drawing Figures

MULTI-SPEED RAMP FOR A VARACTOR TUNING SYSTEM

CROSS-REFERENCE TO RELATED PATENT APPLICATIONS

This application is related to the following applications all of which are assigned to the assignee of the present application and all of which are hereby incorporated by reference. U.S. Pat. No. 3,851,254 entitled "Digital Systems and Method for Determining and Displaying a Television Channel Number," in the names of Richard G. Merrell and Akio Tanaka, Ser. No. 430,446, filed Jan. 3, 1974, entitled "Channel Seeking Tuning System" in the name of Akio Tanaka (hereafter referred to simply as the Tanaka application), Ser. No. 457,010, filed Apr. 1, 1974, entitled "Digital Signal Seeking Tuning SYstem," in the names of John Ma and Akio Tanaka, Ser. No. 466,579, filed May 3, 1974, entitled "All Electronic Digital Tuner System with Memory" in the names of John Ma and Akio Tanaka, Ser. No. 484,475, filed July 1, 1974, entitled "Band Decoder for All Channel Digital Tuning System" in the name of Akio Tanaka, and Ser. No. 492,365, filed July 29, 1974, entitled "Signal Seeking Tuning System with Illegal Channel Detection" in the name of Akio Tanaka.

BACKGROUND OF THE INVENTION

The present invention relates generally to tuning systems and more particularly to all channel electronic television tuning systems having a time-sequenced counting system for determining the system tuning condition by counting the frequency of a tunable element and comparing that with information of a desired channel number. Specifically, it relates to a television tuning system incorporating a multispeed ramp or tuning voltage circuit for changing frequency at a different rate depending upon the proximity of the tuning system frequency to the desired frequency.

A paper by Doyle and Mills (BTR, Vol. 15, No. 2, July, 1969), discusses a channel selection and indication system (in block diagram form) employing a varactor tuner and means for detecting the received television signal and comparing its frequency with the channel number input information. The detection methods described are a frequency synthesizer and a marker (or birdy) synchronizing synthesizer. A comparator compares the incoming signal frequency with the input channel number information and, at equality, operates to send a stop signal to a tuner ramp voltage drive. A later paper by Doyle et al. (BTR, Vol. 18, No. 4, Nov. '72) shows an all channel television tuning system of the birdy frequency synthesizer type which includes an additional reference divisor to provide finer control of tuning when the tuner approaches the desired frequency by providing a change in counting sensitivity.

U.S. Pat. No. 3,798,553 to Sakamoto shows another television frequency sweep operation involving the alternate sweeping by two separate oscillators through the television frequency spectrum in a step-by-step motion. Voltage sweep circuits feed each of the two local oscillators and logic circuitry for providing the sequential advancement of the frequency.

The prior art discloses a number of digital tuning systems having "constant speed" voltage ramp driving circuits. Constant speed is used to indicate that the ramp voltage generated is essentially linear (generally determined by the charge or discharge of a capacitor) and thus produces a fairly uniform frequency sweep depending upon the capacity to tuning voltage characteristic of the varactor diodes. The speed of any ramp voltage system is, of course, governed by the response time of the detection system and a slow ramp speed to accommodate the detection system may introduce unacceptably long channel change times.

OBJECTS OF THE INVENTION

An object of this invention is to provide a novel tuning system.

Another object of this invention is to provide an improved tuning system which minimizes the time required to change tuning.

SUMMARY OF THE INVENTION

A tuning control system comprises a tuner having a varactor diode tunable element, tuning frequency counting means for deriving from the frequency of the tunable element information identifying the corresponding receivable signal, signal selection means, comparison means coupled between the tuning frequency counting means and the signal selection means for determining the difference in information therebetween, and ramp voltage means coupled between the tunable element and the comparison means for driving the varactor diode tunable element to change frequency at a rate based upon the difference information.

DESCRIPTION OF THE PREFERRED EMBODIMENT

Figure 1:
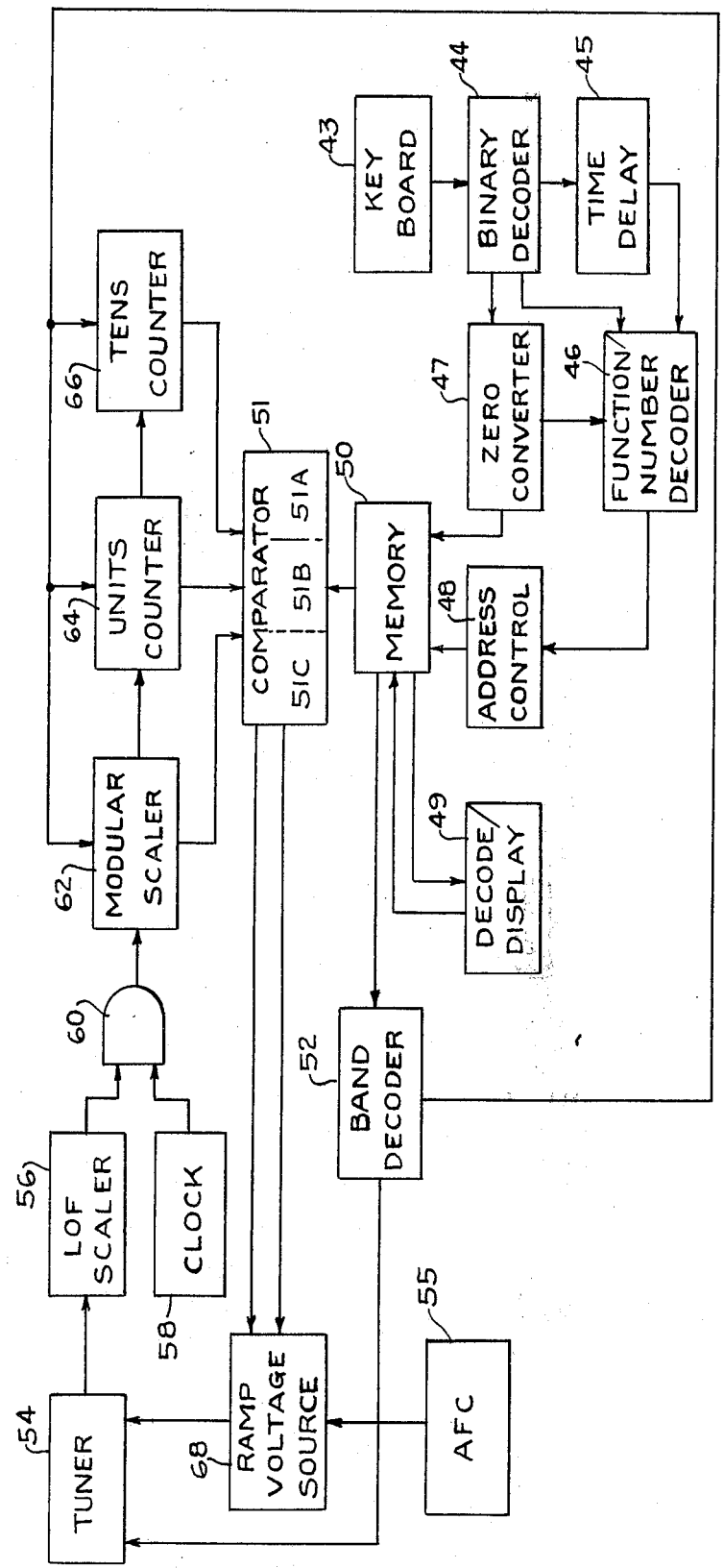
FIG. 1 depicts an embodiment of the tuning control system of the invention in block diagram form.

FIG. 1 is a block diagram depicting a tuning control system constructed in accordance with the invention. A channel number keyboard 43 includes means for entering either desired channel number information or tuning commands to tune the tuner. The keyboard information is encoded into a special binary representation in encoder 44, supplies to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. Zero converter 47 functions to alter the special binary representation used in the encoder to the standard binary representation employed in the remainder of the system. The output of zero converter 47 supplies channel number information in standard binary form to the designated position in memory 50.

The keyboard input can be either a channel number digit or an Up or Down tuning command. The word "command" is used throughout to indicate an Up or Down signal input. The function/number decoder fistly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode/display 49 which provides a visual indication of the channel number at that memory address. Thus, the viewer receives a visual indication of the selected channel information.

The tuning control system has two functional modes designated program and operate. In the program mode, information is entered by the keyboard and stored in the memory by use of the Up and Down commands which cause a serial advancement of accessible memory address positions, whereupon the channel number information is supplied from the keyboard. In the operate mode, an Up or Down command causes advancement to the next sequential address position and information is supplied from the memory to a comparator 51 to cause tuning to the channel represented by the stored channel information. In this mode, a "scratch pad" memory position is automatically accessed upon the input of a channel number and permits direct tuning by the viewer to any selected channel.

Another output of memory 50 is connected to a band decoder 52 which determines, from the encoded channel information stored in memory 50, (1) in which of the several discontinuous frequency bands the selected channel is; (2) whether UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as fully described in the above mentioned Tanaka application, that the tuned signal is within a range of frequencies preselected by a "window."

DEFINITIONS

For simplicity, only logic connections are shown in the figures and only voltage sources and grounds necessary to establish the logic control signal levels are shown. Positive logic is used throughout the logic gates are simply referred to by their function names, i.e., AND, NAND, OR and NOR, without the word "gate." A 1 represents a high logic (or signal voltage) level and a 0 corresponds to a low logic level. Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels.

All binary representations are conventionally aranged in descending powers of 2 from left to right. Leads labelled D, B, C and A and D', and C' interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. $\phi$ represents a timing pulse signal and $\overline{\phi}$ its inverse or complement. If $\phi$ is 0, $\overline{\phi}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs. As far as practical, the various portion of the tuning system will be described in detail on a functional basis. Complete detailed descriptions of the channel computing means, ramp generator (two speed), band decoder and clock are in the Tanaka application, which is incorporated by reference herein. For simplicity, however, these details will not be repeated here.

COMPARATOR 51 (FIG. 2)

Figure 2:
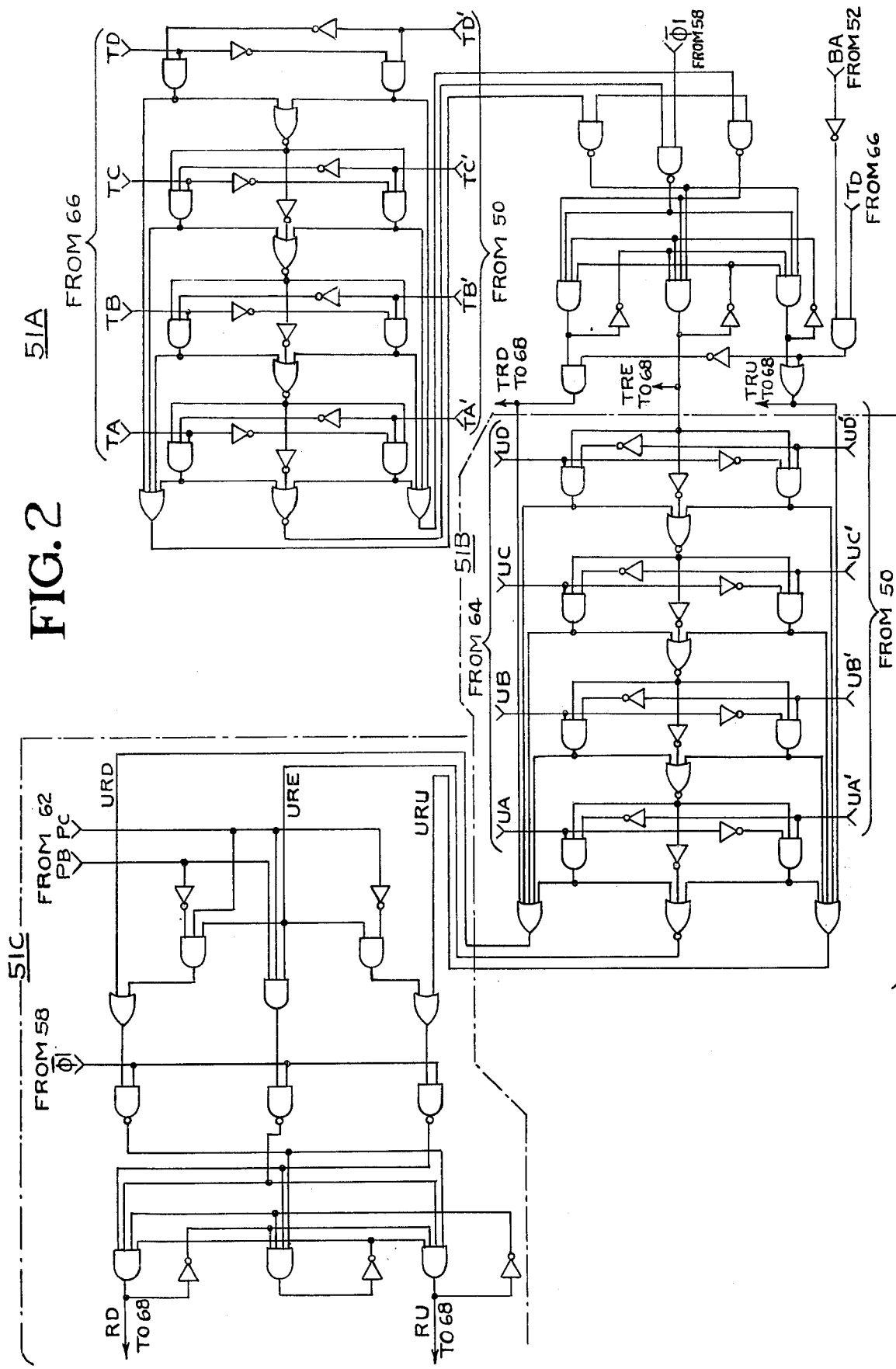
FIG. 2 shows the detail circuitry of comparator 51 of the tuning control system.

FIG. 2 shows the tens and units comparator circuitry which compare the binary representation of the tens and units digits of the derived channel number from the channel number computer with the binary representation of the tens and units digits from memory 50 and the modular comparator which determines when the intrachannel fraction is with the window established by the two preselected modular comparator residues. Appropriate signals indicative of the state of comparator are sent to ramp voltage source 68 for controlling tuner 54.

Both units comparator 51B and tens comparator 51A are of the sequential bit types having four bit-comparison stages, with each stage comprising two AND gates whose outputs are coupled to a NOR gate. In addition each stage has an appropriate output coupled to corresponding OR gates whose outputs indicate whether the larger bit string occurs in the derived channel digit from the channel computer or in the selected digit from the channel counter.

A complete discussion of an essentially identical comparator is in the above mentioned Tanaka application. A very brief summary of comparator operation follows. The BA and TD signals of the tri-flop of tens comparator 51A are for prevention of a condition resulting from a varactor failure mode and these signals may be ignored.

Sequential comparison is achieved by inhibiting the AND's and NOR gates of subsequent comparator stages until equality exists in the higher order stages (corresponding to more significant bits). This procedure determines the direction of the difference in the bit strings. The tens comparator 51A includes a tri-flop (three state device) which monitors the comparator during the compare interval and retains the last determined state until the next comparison which occurs at the $\overline{\phi}_1$ timing pulse. The outputs of the tri-flop indicate that the binary signal from the LOF tens counter 66 is greater than, less than, or equal to the corresponding binary signal from memory 50 and are labelled TRD, TRE and TRU. These signals are sent to ramp voltage source 68 and to the input stage of units comparator 51B.

Units comparator 51B is also a four stage sequential bit comparator similar to the tens comparator with the exception that it does not include tri-flop circuitry. It compares information from LOF units counter 64 and memory 50. The tens comparator overrides units comparison so that if inequality is determined in the tens digit, a simultaneous equality determination (or inequality in the opposite direction) in a units digit will not affect control. As before control is sequentially transferred from stage to stage depending upon comparison of the bit strings and the last stage has three outputs labelled URD, URE and URU to indicate the status of the comparison. These output signals are supplied to the input of modular comparator 51C.

Modular comparator 51C monitors two leads from modular scaler 62 to determine the value of the modular residue. Unlike the previous comparator sections the modular comparator does not have four stages for binary string comparisons. Rather it identifies the residue (indicated by leads PB and PC) from modular scaler 62 as being less than, equal to, or greater than the two preselected residues selected to define the frequency window. This determination is retained with tri-flop circuitry similar to that incorporated in tens comparator 51A.

The frequency window may be skewed relative to the channel picture carrier frequency by selection of appropriate residues. In addition, as described in the Tanaka application, the base of the modular scaler may be increased (preferably by a multiple of six) and a new set of two or more residues chosen to tailor the window as desired.

As is true for the units comparator, the modular comparator is overriden when an inequality exists between the units (or tens digits). Thus, a determination of inequality in the units comparator overides the modular comparator, and it only controls the ramp voltage source when there is equality between both the tens and units digits of the derived and desired channel number. The state of the modular comparator is monitored by tri-flop circuitry whose outputs RD and RU are at 1 levels for ramp down and ramp up determinations, respectively. The RD and RU signals are supplied directly to ramp voltage source 68.

RAMP VOLTAGE SOURCE 68 (FIG. 3)

Figure 3:
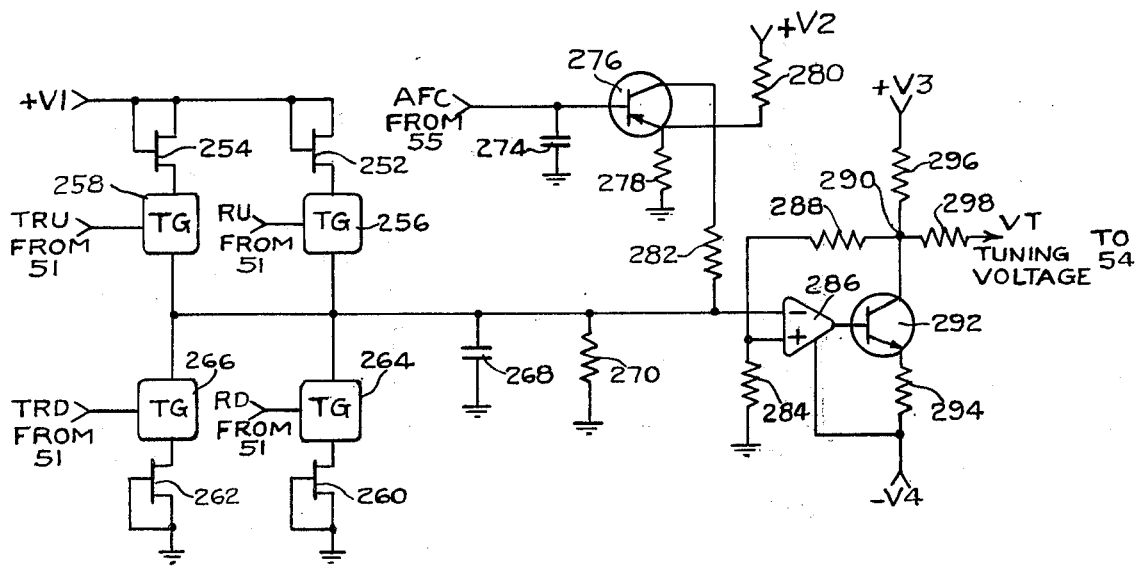
FIG. 3 shows the detail circuitry of the ramp voltage source of block 68.

Referring now to FIG. 3, ramp voltage source 68 is supplied information as to the state of the comparator and produces appropriate voltages for adjusting the tuner by selective activation of a plurality of transmission gates coupled to appropriate current sources and sinks. Ramp source 68 has two "tuning speeds" or voltage characteristics, with a higher rate of voltage change occurring in response to an inequality in the tens comparator than for inequalities in the units or modular comparators. As will be seen, inequalities in the tens comparator activate both the tens and units transmission gates for the high ramp speed, whereas for units and modular comparator unequalities, only the units gate is activated for the low speed ramp. The ramp voltage drives an operational amplifier for developing the actual tuning voltages. The polarity or ramp direction is determined by whether the comparator "signals for" an increase or decrease in tuning frequency.

A source of voltage +V1 is connected to the gate electrodes and source electrodes of a FET 252 and a FET 254. Their drain electrodes are connected respectively to the inputs of a pair of transmission gates 356 and 258. A pair of FET's 260 and 262 have their source and gate electrodes connected to ground and their drain electrodes connected respectively to the inputs of a pair of transmission gates 264 and 266. The outputs of transmission gates 256, 258, 264 and 266 are connected to one terminal of a tuning capactior 268, the other terminal being connected to ground. A resistor 270 is connected in parallel with capacitor 268.

A conventionally derived source of AFC voltage is supplied to the base of a transistor 276 which is coupled to ground through a capacitor 274. Another source of positive voltage +V2 is supplied across a voltage divider comprising a resistor 280 and a resistor 278. The junction of the divider connects to the emitter of transistor 276 and establishes proper operating bias. The collector of transistor 276 is connected through a resistor 282 to tuning capacitor 268, and to the negative input terminal of an operational amplifier 286. The positive input terminal of the operational amplifier is connected to ground through a resistor 284 and through a resistor 288 to a collector terminal 290 of a transistor 292. A source of positive voltage +V3 is applied through a resistor 296 to terminal 290. A source of negative voltage −V4 is supplied through a resistor 294 to the emitter of transistor 292. −V4 also supplies power to operational amplifier 286. The base of transistor 292 is supplied with the output signal of the operational amplifier and the tuning voltage for the varactor tuner is taken from terminal 290, through a resistor 298. The transmission gates are well known in the art and a package of four such gates may be obtained under the RCA designation CD4016.

Each gate has a control terminal which is connected to the comparator. The control terminals of gates 256 and 264 are connected, respectively, to leads labelled RU and RD (ramp up and ramp down) in modular comparator 51C. The control terminals of gates 258 and 266 are connected, respectively, to signal leads labelled TRU (tens ramp up) and TRD (tens ramp down) in tens comparator 51A.

The transmission gates are activated by a 1 level signal on their respective control terminals. The gates supply capacitor 268 which substantially maintains its voltage until charge is added or removed. The tuning capacitor voltage is applied to the varactor tuner through operational amplifier 286 and transistor 292 thus enabling control with low voltage circuitry suitable for integrated circuit applications.

The ramp direction is up (higher tuning frequency desired) for energization of gates 256 and 258 and down for energization of gates 264 and 266. FET's 254 and 262 have higher current capabilities than their counterparts 252 and 260. When a TRU or TRD signal is produced, the corresponding RU or RD signal is also produced. Thus the high speed ramp involves activation of both transmission gates 256 and 258 for up and both 264 and 266 for down. On the other hand only an RU or RD signal is developed for differences in either the units or modular comparators. Thus the system produces a higher rate ramp voltage for differences in the tens comparator than for differences in the units and modular comparators. When equality is reached in comparator 51 all transmission gates are in the off state and the effect of the conventional AFC in making incremental voltage changes on capacitor 268 is felt.

The AFC voltage which varies as a function of the received signal IF frequency deviations is applied to the base of transistor 276 and exerts control on the voltage level of tuning capacitor 268. If the AFC voltage goes down, transistor 276 is turned on charging capacitor 268 through resistor 282 to raise the voltage at junction 290 through operational amplifier 286. If the AFC voltage increases, transistor 276 is turned off and charge is slowly leaked from the capacitor through resistor 270 to reduce the tuning voltage.

The invention disclosed provides a varactor diode tuning system including a multi-speed ramp voltage circuit for changing the frequency of the tunable element at a rate depending upon the proximity of the tuning system to the desired frequency. It provides multi-speed in either increase or decreasing frequency directions to permit any selected tuning frequencies to be tuned in a minimal time.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A tuning control system, comprising:
    a tuner having a varactor diode tunable element operable in a frequency band containing a plurality of receivable signals;
    tuning frequency counting means for determining from the frequency of said tunable element information identifying the corresponding receivable signal;
    signal selection means;
    comparison means coupled between said tuning frequency counting means and said signal selection means for determining the difference between information from said signal selection means and information from said tuning frequency counting means; and
    ramp voltage driving means, coupled between said tunable element and said comparison means for impressing a ramp tuning voltage at a variable rate dependent upon said difference across said varactor diode to change the frequency of said tuner at a rate based upon said difference.

2. The tuning control system of claim 1, wherein said rate is greater for a large magnitude in said difference.

3. The tuning control system of claim 2, wherein said ramp voltage means includes a tuning capacitor for developing said tuning voltage and means for varying the charging rate of said capacitor as a function of said difference.

4. The tuning control system of claim 3, wherein said means for varying the charging rate includes a plurality of electrical power sources, a corresponding plurality of transmission gates coupled between said power sources and said tuning capacitor and means coupling said transmission gates to said comparison means.

5. The tuning control system of claim 4 wherein said plurality of power sources includes two power sources of different charge transfer capabilities providing two distinct charging rates for said tuning capacitor.

6. The tuning control system of claim 5 wherein said plurality of receivable signals are each identifiable by designated channel numbers and wherein said comparison means compares desired channel numbers from said signal selection means with derived channel numbers from said tuning frequency counting means.

7. The tuning control system of claim 6, wherein said comparison means separately determines the difference between digits of said selected and derived channel members.

8. The tuning control system of claim 7, wherein said receivable signals are television signals having two digit channel numbers and wherein a first of said two power sources is activated by an inequality in the units digits of said derived and desired channel numbers to provide a first rate and a second of said two power sources is activated by an inequality in the tens digits to provide a second greater tuning rate.

9. The tuning control system of claim 8, wherein said ramp voltage means is bi-directional and includes means for driving said tunable element in a direction to minimize said difference as determined by said comparison means.

10. The tuning control system of claim 9, wherein said two power sources each comprises an equal capacity current source and current sink each coupled to said tuning capacitor through corresponding pairs of selectively operable transmission gates wherein activation of a source or sink transmission gate respectively by the difference detected in said comparision means increases or decreases the voltage across said tuning capacitor.

11. The tuning control system of claim 10, wherein said comparison means includes means for activating an up or down units transmission gate whenever the corresponding up or down tens transmission gate is activated.

* * * * *